United States Patent [19]

Saitoh

[11] Patent Number: 4,963,835

[45] Date of Patent: Oct. 16, 1990

[54] DIFFERENTIAL AMPLIFIER WITH AN IMPROVED GAIN CHARACTERISTIC IN A HIGH FREQUENCY REGION

[75] Inventor: Yasuo Saitoh, Tokyo, Japan

[73] Assignee: NEC Corporation, Tokyo, Japan

[21] Appl. No.: 391,285

[22] Filed: Aug. 8, 1989

[30] Foreign Application Priority Data

Aug. 9, 1988 [JP] Japan .................................. 63-199425

[51] Int. Cl.⁵ ............................................. H03F 3/45
[52] U.S. Cl. ................................................... 330/253
[58] Field of Search ................. 330/69, 252, 253, 292, 330/302

[56] References Cited

U.S. PATENT DOCUMENTS 3,885,219 5/1975 Vaughn ............................ 330/260 X
4,053,795 10/1977 Cochran ........................... 330/253 X

FOREIGN PATENT DOCUMENTS 293008 12/1986 Japan .................................... 330/253

Primary Examiner—James B. Mullins
Attorney, Agent, or Firm—Helfgott & Karas

[57] ABSTRACT

In a differential amplifier (10) with an input terminal (19) supplied with an input signal having an input voltage which has an input D.C. level of a zero voltage, an inductance element (70) has one end connected to a reference terminal (20) and another end connected to an earth terminal (19) which is supplied with the zero voltage.

3 Claims, 3 Drawing Sheets

DIFFERENTIAL AMPLIFIER WITH AN IMPROVED GAIN CHARACTERISTIC IN A HIGH FREQUENCY REGION

BACKGROUND OF THE INVENTION

This invention relates to a differential amplifier and, more specifically, to a differential amplifier with an input terminal supplied with an input signal having an input voltage which has an input D.C. level of a reference voltage such as a zero voltage.

Such a differential amplifier is used to supply a double balanced mixer (DBM) with a pair of signals which have normal and inverted phases, respectively. The differential amplifier is also used as a first stage amplifier of a D.C. directly connected amplifier device comprising a plurality of differential amplifiers as unit amplifiers in order to be able to afford for dispersion of characteristics of elements which compose the D.C. directly connected amplifier device.

Various differential amplifiers are already known. For example, a differential amplifier is reported by Masafumi SHIGAKI et al in a Japanese technical paper contributed to "Densi Tûsin Gakkai Gijutsu Kenkyû Hôkoku (Report of Technical Study of the Institute of Electronics and Communication Engineers of Japan)" as Paper No. SSD85-115 under the title of "GaAs Monolithic Front End IC" according to contributors' translation. The differential amplifier disclosed by SHIGAKI et al., is implemented by an integrated circuit.

In the manner which will later be described, a conventional differential amplifier of the type described is for use in combination with a pair of level shift circuits. The conventional differential amplifier has first and second power supply terminals supplied with positive and negative source potentials, respectively. An earth terminal is supplied with a zero voltage. A reference terminal is supplied with the zero voltage. First and second output terminals are for producing first and second output signals having first and second output voltages, respectively. Each of the first and the second output voltages is representative of a difference between the input voltage and the zero voltage. The first and the second output voltages have inverted polarities relative to each other. In the conventional differential amplifier, the reference terminal is directly connected to the earth terminal.

The conventional differential amplifier is defective in that its gain decreases in a high frequency region for the reason which will later be described in conjunction with one of a few figures of the accompanying drawing.

SUMMARY OF THE INVENTION

It is therefore an object of the present invention to provide a differential amplifier which has a high gain in not only a low frequency region but also a high frequency region.

Other objects of the present invention will become clear as the description proceeds.

A differential amplifier to which the present invention is applicable comprises first and second power supply terminals supplied with first and second power source potentials, respectively, a reference voltage terminal supplied with a reference voltage between the first and the second power source potentials, an input terminal supplied with an input signal having an input voltage which has an input D.C. level of the reference voltage, a reference terminal for being supplied with the reference voltage, differentially operable first and second field effect transistors having first and second gate terminals connected to the input terminal and the reference terminal, first and second drain terminals, and first and second source terminals, respectively, resistors provided between the first power supply terminal and the first and the second drain terminals, and a constant current source positioned between the first and the second source terminals and the second power supply terminal, and a first and a second output terminals connected to the first and the second drain terminals for producing first and second output signals having first and second output voltages, respectively. Each of the first and the second output voltages is representative of a difference between the input voltage and the reference voltage. The first and the second output voltages have inverted polarities relative to each other. According to the present invention, the differential amplifier comprises an inductance element having one end connected to the reference terminal and another end connected to the reference voltage terminal. The inductance element is provided for improving a gain characteristic of the differential amplifier in a high frequency region.

DESCRIPTION OF THE PREFERRED EMBODIMENT

Figure 1:
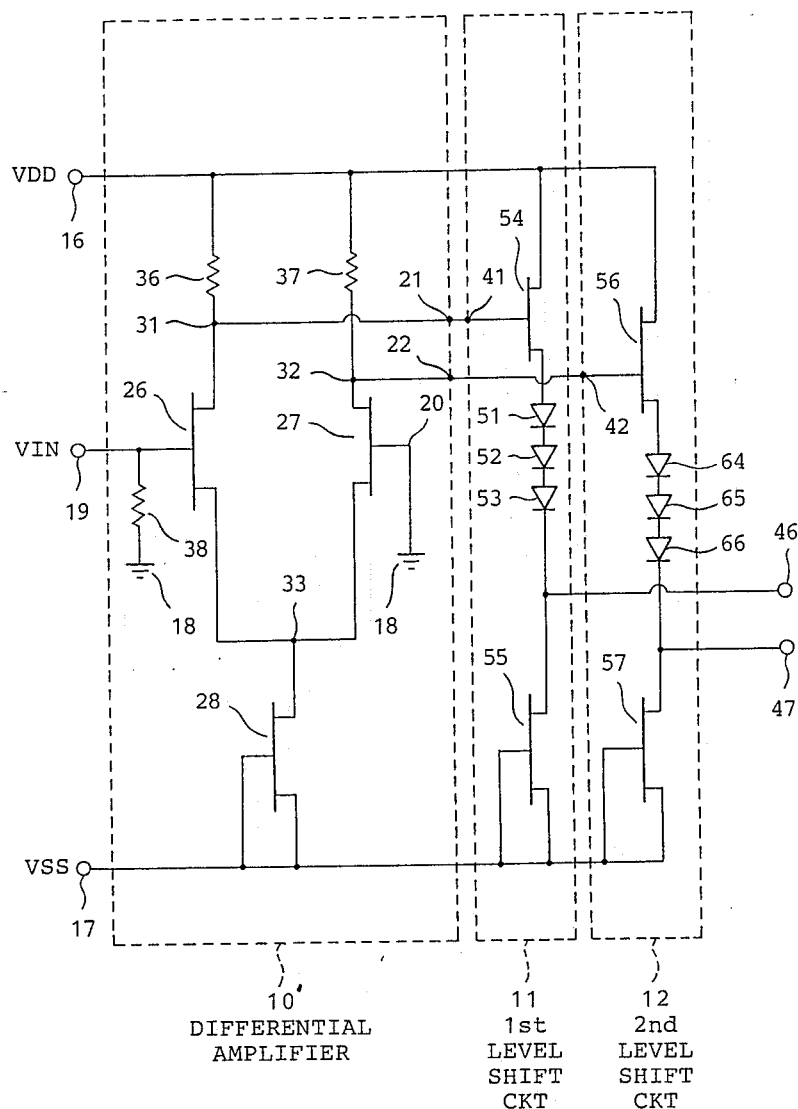
FIG. 1 is a circuit diagram of a conventional differential amplifier for use in combination with a pair of level shift circuits.

Referring to FIG. 1, a conventional differential amplifier 10' will be described at first in order to facilitate an understanding of the present invention. The differential amplifier 10' is for use in combination with a pair of level shift circuits which comprise first and second level shift circuits 11 and 12.

The differential amplifier 10' comprises first and second power supply terminals 16 and 17 which are supplied with positive and negative source potentials VDD and VSS, respectively. An earth terminal 18 is supplied with a zero voltage. An amplifier input terminal 19 is supplied with an amplifier input signal having an amplifier input voltage VIN which has an input D.C. level of the zero voltage. A reference terminal 20 is connected directly to the earth terminal 18 and supplied with the zero voltage. First and second amplifier output terminals 21 and 22 are for producing first and second amplified output signals having first and second amplified output voltages, respectively. Each of the first and the second amplifier output voltages is representative of a difference between the amplifier input voltage an the zero voltage. The first and the second amplified output voltages have inverted polarities relative to each other.

In the differential amplifier, each transistor is a field effect transistor having gate, drain, and source terminals.

The differential amplifier 10' comprises differentially operable first and second transistors 26 and 27 connected to the amplifier input and the reference terminals 19 and 20, respectively, and a third transistor 28 connected to the second power supply terminal 17. The first and the second transistors 26 and 27 have first and second nodes 31 and 32 connected to the first and the second amplifier output terminals 21 and 22, respectively. The first transistor 26 has a gate terminal connected to the amplifier input terminal 19 and a drain terminal connected to the first node 31. The second transistor 27 has a gate terminal connected to the reference terminal 20 and a drain terminal connected to the second node 32. The source terminals of the first and the second transistors 26 and 27 are connected together at a source coupling 33.

The differential amplifier 10' further comprises a first resistor 36 between the first power supply terminal 16 and the first node 31 and a second resistor 37 between the first power supply terminal 16 and the second node 32. The third transistor 28 is interposed between the source coupling 33 and the second power supply terminal 17. The third transistor 28 has a drain terminal connected to the source coupling 33. The gate and the source terminals of the third transistor 28 are connected to the second power supply terminal 17. The third transistor 28 serves as a constant current source. The source coupling 33 acts as a hypothetical earth point which is hypothetically connected to the earth terminal 18. A third resistor 38 has one end connected to the amplifier input terminal 19 and another end connected to the earth terminal 18. Each of the first through the third transistors 26 to 28 has a gate width of two hundred microns.

The first and the second level shift circuits 11 and 12 have first and second shift input terminals 41 and 42 connected to the first and the second amplifier output terminals 21 and 22, respectively, and first and second shift output terminals 46 and 47 for producing first and second shifted output signals, to which the first and the second amplified output signal are shifted, respectively.

The first level shift circuit 11 comprises first through third diodes 51, 52, and 53, and fourth and fifth transistors 54 and 55 which are connected to one another in series. The fourth transistor 54 has a gate terminal connected to the first shift input terminal 41, a drain terminal connected to the first power supply terminal 16, and a source terminal connected to an anode terminal of the first diode 51. The third diode 53 has a cathode terminal connected to the first shift output terminal 4. The fifth transistor 55 has a drain terminal connected to the first shift output terminal 46. The gate and the source terminals of the fifth transistors 55 are connected to the second power supply terminal 17.

The second level shift circuit 12 comprises sixth and seventh transistors 56 and 57, and fourth through sixth diodes 64, 65, and 66 which are connected to one another in series. The sixth transistor 56 has a gate terminal connected to the second shift input terminal 42, a drain terminal connected to the first power supply terminal 16, and a source terminal connected to another terminal of the fourth diode 64. The sixth diode 66 has a cathode terminal connected to the second shift output terminal 47. The seventh transistor 57 has a drain terminal connected to the second shift output terminal 47.

The gate and the source terminals of the seventh transistors 55 are connected to the second power supply terminal 17.

Each of the fourth through the seventh transistors 54 to 57 has a gate width of fifty microns. Each of the first through the sixth diodes 51 to 53 and 64 and 66 has a gate width which is also fifty microns wide.

In a high frequency region, the third transistor has a drain-to-source capacitance Cds and a drain conductance gd. As a result, the third transistor 28 has a low internal resistance in a high frequency regions, for example, between two and five gigahertz. Accordingly, the source coupling 33 does not act as the hypothetical earth pont in the high frequency region. Therefore, the conventional differential amplifier 10' is disadvantageous in that its gain decreases in the high frequency region.

Figure 2:
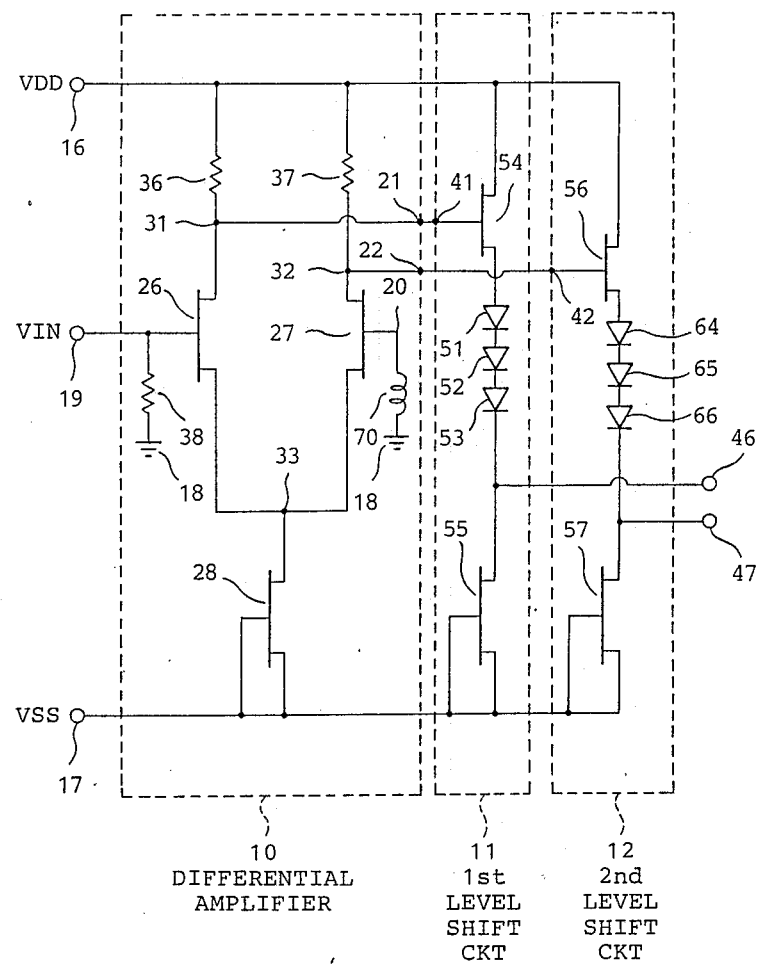
FIG. 2 is a circuits diagram of a differential amplifier according to an embodiment of the instant invention that is for use in combination with the pair of level shift circuits.

Referring now to FIG. 2, the description will proceed to a differential amplifier 10 according to an embodiment of the present invention. The differential amplifier 10 comprises similar parts which are designated by like reference numerals and operable with likewise named and denoted signals.

It should be noted in connection with the differential amplifier 10 that the reference terminal 20 is not directly connected to the earth terminal 18 but is connected indirectly to the earth terminal 18 through an inductance element 70. Stated otherwise, the differential amplifier 10 comprises the inductance element 70 which has one end connected to the reference terminal 20 and another end connected to the earth terminal 18. In other respects, the differential amplifier 10 is not different in structure from the conventional differential amplifier 10'.

With this structure, the third resistor 38 serves as not only a gate bias element for the first transistor 26 but also a matching element for matching with an input impedance of the differential amplifier 10. In addition, the inductance element 70 acts as not only a gate bias element for the second transistor 27 but also a characteristic improving element for improving a gain characteristic of the differential amplifier 10 in a high frequency region.

For the differential amplifier 10, it will be presumed that the inductance element 70 has an inductance L1 and the second transistor 27 has a gate-to-source capacitance Cgs. In this event, a combination of the inductance element 70 and the second transistor 27 composes an equivalent circuit which equivalently comprises the inductance L1 and the capacitance Cgs connected to each other in series between the source coupling 33 and the earth terminal 18 and which serves as a series resonance circuit having a resonance frequency fres given by:

$$fres = \tfrac{1}{2}\pi \sqrt{L1 \times Cgs} \ .$$

As a result, the source coupling 33 has a low impedance as long as the input signal has an input frequency which is lower than the resonance frequency fres. Accordingly, it is possible for the differential amplifier 10 to prevent reduction of its gain while the input frequency of the input signal is not higher than the resonance frequency fres.

Figure 3:
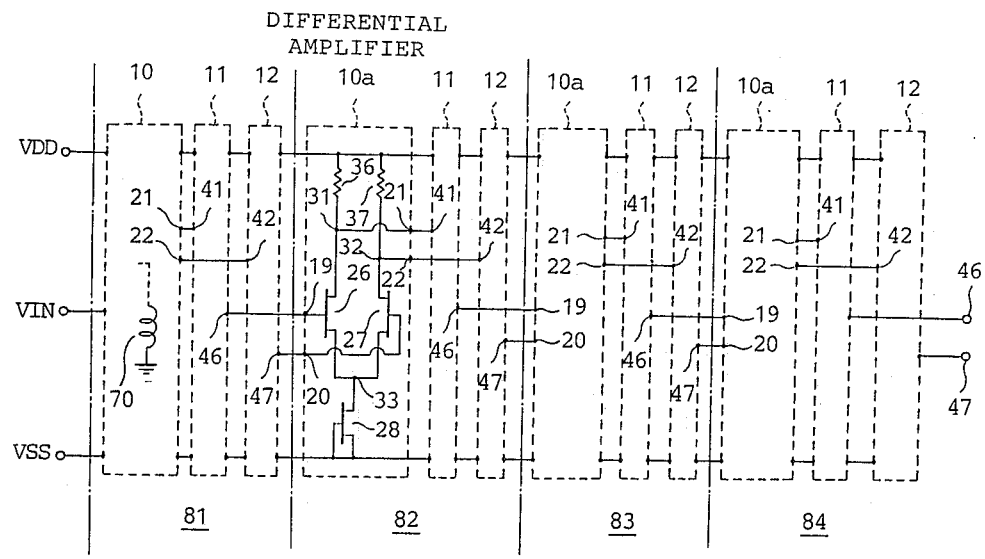
FIG. 3 is a block diagram of a D.C. directly connected amplifier device including the differential amplifier shown in FIG. 2 as a first stage amplifier.

Referring to FIG. 3, the description will proceed to a D.C. directly connected amplifier device which includes the differential amplifier 10 illustrated in FIG. 2.

The D.C. directly connected amplifier device is a four-stage amplifier circuit which comprises first-stage through fourth-stage amplifiers 81, 82, 83, and 84 connected in cascade.

The first-stage amplifier 81 is composed of a combination of the differential amplifier 10 and the first and the second level shift circuits 11 and 12 as shown in FIG. 2. Each of the second-stage through the fourth-stage amplifiers 82 to 84 is similar to the first-stage amplifier 81 except that the differential amplifier is modified from that illustrated in FIG. 2 as will later become clear. The differential amplifier is therefore depicted at 10a.

In each differential amplifier 10a of the second-stage through the fourth-stage amplifiers 82 to 84, the gate terminals of the first and the second transistors 26 and 27 are directly connected to the first and the second shift output terminals 46 and 47 in a previous stage amplifier. In other words, the differential amplifier 10a is similar to the differential amplifier 10 illustrated in FIG. 2 except that the third resistor 38 and the inductance element 70 are removed from the differential amplifier 10.

Figure 4:
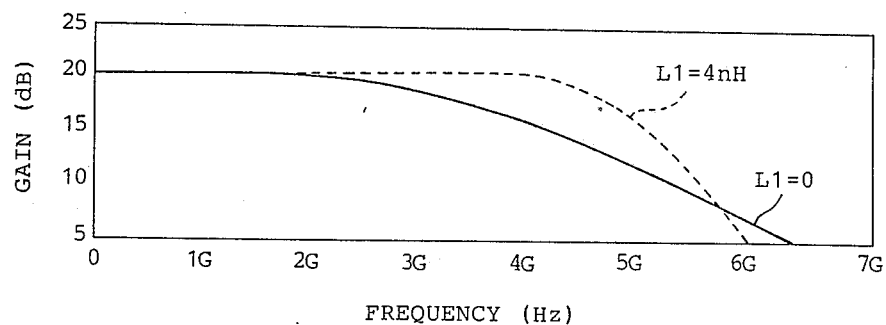
FIG. 4 shows gain characteristics of the D.C. directly connected amplifier device shown in FIG. 3 and of a conventional D.C. directly connected amplifier device which includes the conventional differential amplifier shown in FIG. 1 as the first stage amplifier.

Referring to FIG. 4, the abscissa and the ordinate represent frequency (Hz) and gain (db), respectively. A dotted line shows a gain characteristic of the D.C. directly connected amplifier device illustrated in FIG. 3. A solid line shows a gain characteristic of a conventional D.C. directly connected amplified device which includes the conventional differential amplifier 10' illustrated in FIG. 1 instead of the differential amplifier 10 illustrated in FIG. 2 as the first stage amplifier 81.

For the D.C. directly connected amplifier device illustrated in FIG. 3, it will be presumed that the inductance element 70 of the differential amplifier 10 has the inductance L1 equal to 4 nH. In the conventional D.C. directly connected amplifier, the conventional differential amplifier 10' of FIG. 1 is equivalent to the differential amplifier 10 of FIG. 2 if the inductance element 70 of the differential amplifier 10 has the inductance L1 equal to 0 nH. As shown in FIG. 4, both of the conventional D.C. directly connected amplifier and the D.C. directly connected amplifier device of FIG. 3 have the same gain of 20 dB in a low frequency region which is, for example, lower than 2 GHz. In the conventional D.C. directly connected amplifier, namely, when the inductance element 70 has the inductance of 0 nH, its gain decreases by 1 dB at a frequency of 2.5 GHz in comparison with that of the low frequency region as shown in the solid line of FIG. 4. In the D.C. directly connected amplifier illustrated in FIG. 3, namely when the inductance element 70 has the inductance of 4 nH, its gain decreases by 1 dB at a frequency of 4.5 GHz in comparison with that of the low frequency region as shown in the dotted line of FIG. 4. Accordingly, it is clear that the gain characteristic of the directly connected amplifier illustrated in FIG. 3 is improved in the high frequency region in comparison with that of the conventional D.C. directly connected amplifier.

While this invention has thus far been described in specific conjunction with a preferred embodiment thereof, it will now be readily possible for one skilled in the art to carry this invention into effect in various other manners. For instance, the differential amplifier may be implemented by an emitter-coupled differential amplifier which comprises bipolar transistors. While the inductance element 70 has one end connected to the earth terminal in the above-explained embodiment of the present invention, the inductance element 70 may have one end connected to a terminal having a d.c. voltage between the positive and the negative power source potentials VDD and VSS which is same as the reference or bias voltage of the input signal via supplied to the input terminal.

What is claimed is:

1. A differential amplifier comprising first and second power supply terminals supplied with first and second power source potentials, respectively, a reference voltage terminal supplied with a reference voltage between said first and said second power source potentials, an input terminal supplied with an input signal having an input voltage which has an input D.C. level of said reference voltage, a reference terminal for being supplied with said reference voltage, differentially operable first and second field effect transistors having first and second gate terminals, first and second drain terminals, and first and second source terminals, respectively, resistors between said first power supply terminal and said first and said second drain terminals, a constant current source between said first and said second source terminals and said second power supply terminal, said first gate terminal being connected to said input terminal and said second gate terminal being connected to said reference terminal, and first and second output terminals connected to said first and said second drain terminals for producing first and second output signals having first and second output voltages, respectively, each of said first and second output voltages being representative of a difference between said input voltage and said reference voltage, said first and said second output voltages having inverted polarities relative to each other, wherein the improvement comprises an inductance element having one end connected to said reference terminal and another end connected to said reference voltage terminal, said inductance element being positioned so as to improve a gain characteristic of said differential amplifier in a high frequency region.

2. A differential amplifier as claimed in claim 1, wherein said constant current source comprises a third field effect transistor having a third gate terminal connected to said second power supply terminal, a third drain terminal connected to said first and said second source terminals in common, and a third source terminal connected to said second power supply terminal.

3. A differential amplifier as claimed in claim 2, wherein said reference voltage is a grounding voltage, said first power source potential being higher than said grounding voltage and said second power source potential being lower than said grounding voltage.

* * * * *